(12) United States Patent
Chien

(10) Patent No.: US 6,971,886 B2
(45) Date of Patent: Dec. 6, 2005

(54) LGA TO PGA PACKAGE ADAPTER

(75) Inventor: Ray Chien, Hsin Tien (TW)

(73) Assignee: Via Technologies, Inc., Taipei Hsien (TW)

( * ) Notice: Subject to any disclaimer, the term of this patent is extended or adjusted under 35 U.S.C. 154(b) by 27 days.

(21) Appl. No.: 10/225,233

(22) Filed: Aug. 22, 2002

(65) Prior Publication Data

US 2004/0038562 A1 Feb. 26, 2004

(30) Foreign Application Priority Data

Nov. 9, 2001 (TW) .............................. 90219325 U

(51) Int. Cl.⁷ .......................... H01R 12/00; H05K 1/00
(52) U.S. Cl. ...................................................... 439/71
(58) Field of Search ............................ 439/71, 70, 525, 439/69

(56) References Cited

U.S. PATENT DOCUMENTS

| | | | | |
|---|---|---|---|---|
| 3,685,002 A | * | 8/1972 | Kennedy | 439/525 |
| 4,037,270 A | * | 7/1977 | Ahmann et al. | 361/689 |
| 6,397,460 B1 | * | 6/2002 | Hembree | 29/832 |

* cited by examiner

*Primary Examiner*—Javaid H. Nasri
(74) *Attorney, Agent, or Firm*—Birch Stewart Kolasch & Birch LLP

(57) ABSTRACT

An adapter assembly is provided for adapting an LGA packaged IC to a PGA socket. The adapter assembly comprises a package body with a plurality of through holes, and a plurality of pins received in the through holes and each having a spring end and an insertion end. The spring end of the pin abuts against an electric contact land of the LGA packaged IC and the insertion end of the pin is inserted into the PGA socket, whereby the LGA packaged IC is in electrical connection to the PGA socket.

11 Claims, 6 Drawing Sheets

LGA TO PGA PACKAGE ADAPTER

FIELD OF THE INVENTION

The present invention relates to an adapter assembly for adapting integrated circuits (ICs) to a socket of different package types, especially to an adapter assembly for mounting an IC in a land grid array (LGA) package to a pin grid array (PGA) socket.

BACKGROUND OF THE INVENTION

Due to performance limitations and cost factors, the packaging of microelectronics has become increasingly important in computer and other electronic systems. Therefore, the packaging of microelectronics is under extensive research for cost reduction and performance enhancement.

A conventional central processing unit (CPU) can be mounted onto a motherboard by surface mount technology (SMT), such as the solder reflow process. However, the replacement of the CPU involves the cumbersome steps of extracting the CPU and the removal and cleaning of solder. To overcome this problem, a PGA package is developed for CPU packaging. As shown in FIG. 1, a CPU (1a) is packaged in a package body (10a). A heat sink (20a) and a fan (30a) are in turn arranged atop the package body (10a). An array of pins (11a) is vertically arranged on a lower surface of the package body (10a). A socket (40a) mounted on a motherboard (4a) by solder reflow is provided with a plurality of contact holes for accommodating matching pins (11a) therein. The package body (10a) is detachably mounted onto the socket (40a) such that the CPU (1a) is electrically connected to the motherboard (4a). However, the packaging cost of the CPU (1a) is high and the pins (11a) thereof face some risk of deformation and breaking.

Moreover, an LGA package is developed to replace the expensive PGA package, wherein contact lands or solder pads are used to replace pins. However, motherboard vendors, for cost issues, are reluctant to manufacture both motherboards with a PGA socket for CPUs in PGA package and motherboards with an LGA socket for CPUs in LGA package. Therefore, an adapter is required so as to use LGA packaged CPUs on motherboards with PGA sockets.

SUMMARY OF THE INVENTION

It is an object of the present invention to provide an adapter for mounting of an IC in an LGA package to a PGA socket.

To achieve the above-mentioned object, the present invention provides an adapter assembly for adapting an LGA packaged IC to a PGA socket. The adapter assembly comprises a package body with a plurality of through holes provided therein, and a plurality of pins passing through the through holes, each of these pins having a spring end and an insertion end. The spring end of the pin is provided for abutting against an electric contact land of the LGA packaged IC and the insertion end of the pin is provided for connection to the PGA socket, thereby the LGA packaged IC being in electrical connection with the PGA socket.

The various objects and advantages of the present invention will be more clearly understood from the following detailed descriptions while being read in conjunction with the appended drawings, in which:

DETAILED DESCRIPTION OF THE INVENTION

Figure 1:
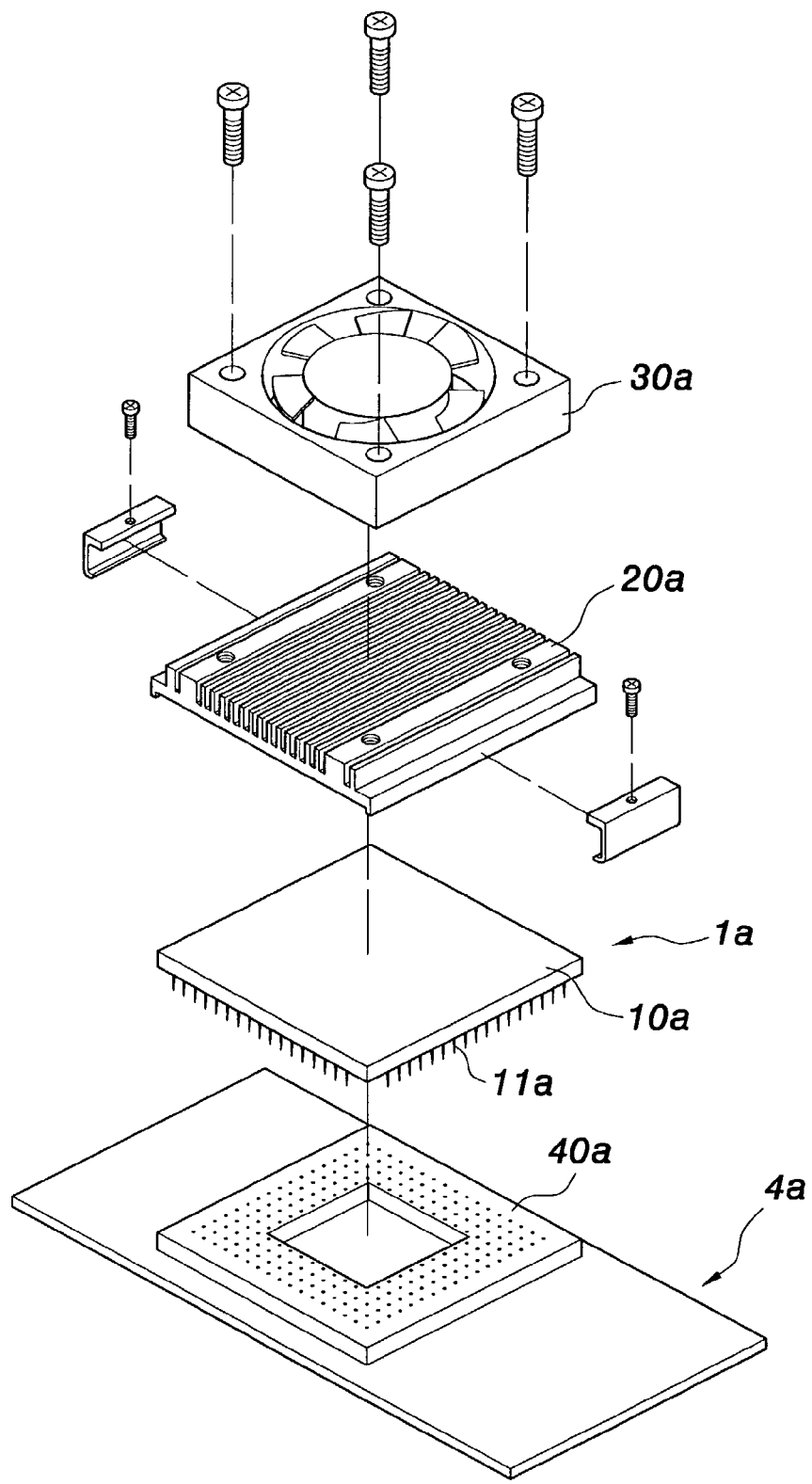
FIG. 1 shows an exploded view of a prior art PGA packaged CPU.
Figure 2:
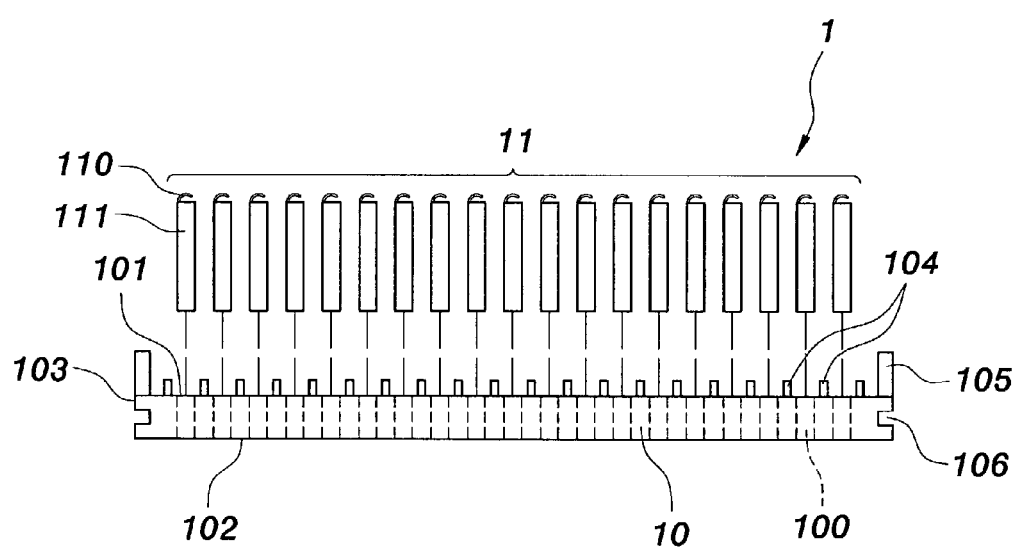
FIG. 2 shows a sectional exploded view of the invented adapter assembly prior to pin insertion.
Figure 3:
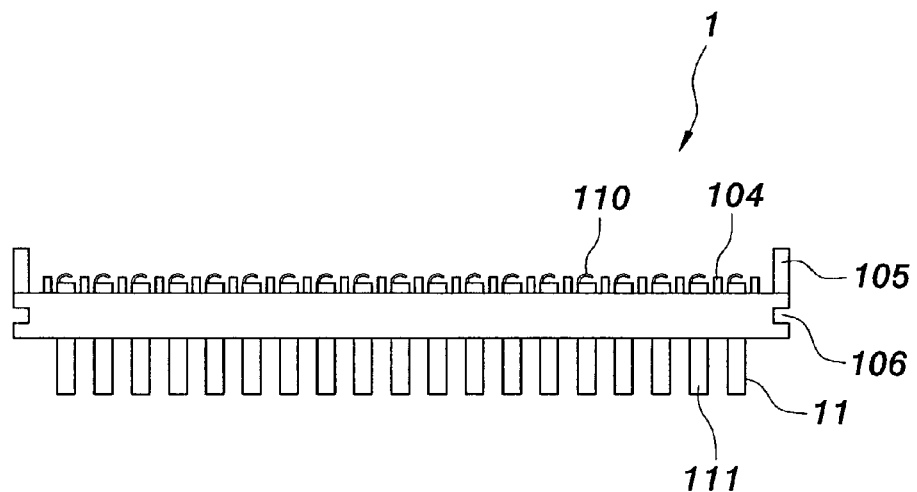
FIG. 3 shows a sectional view of the invented adapter assembly with a concave locking section (notches)
Figure 4:
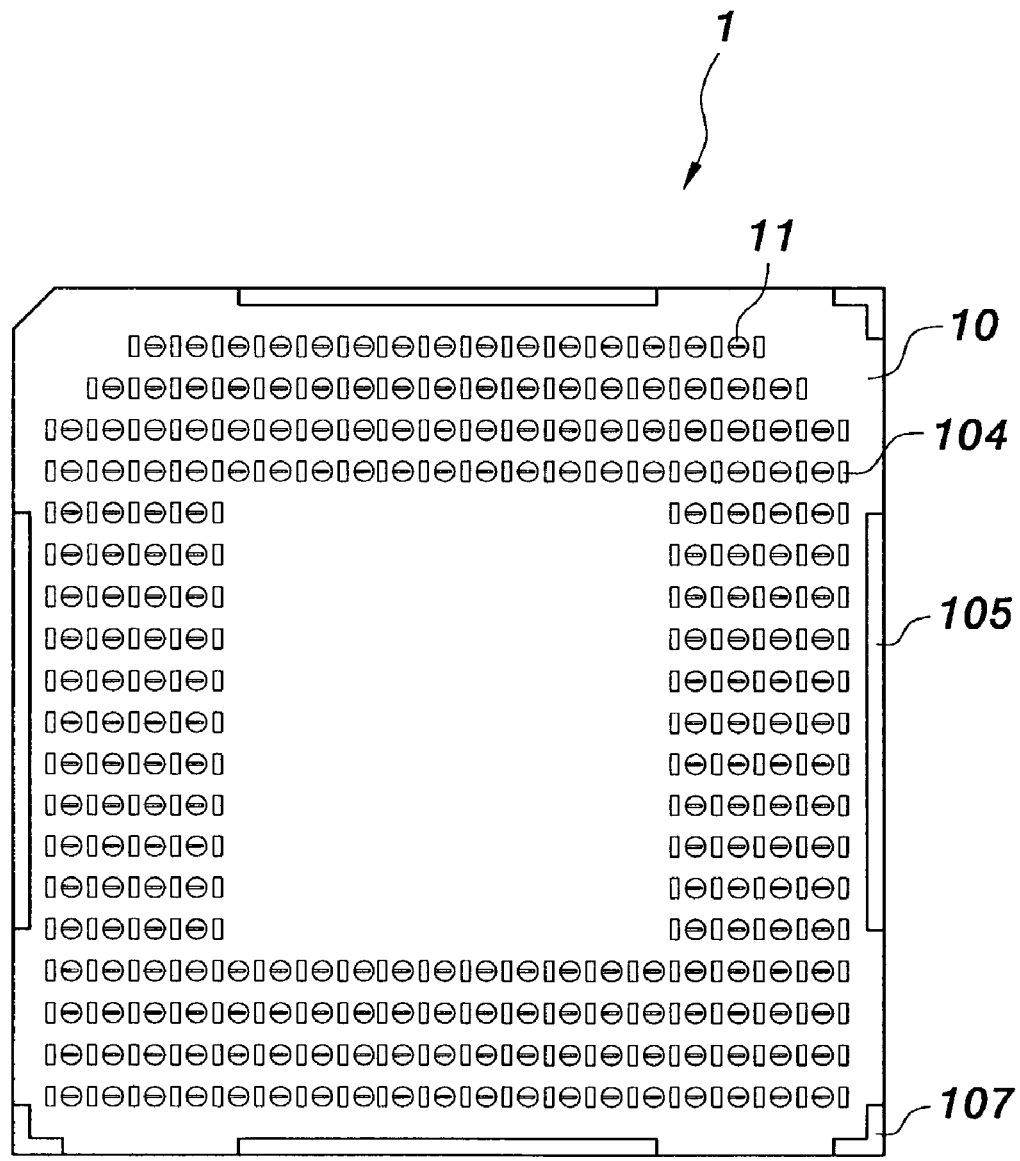
FIG. 4 shows a top view of the invented adapter assembly.

FIGS. 2, 3 and 4 show a partially sectional view, the sectional view and the top view of the adapter assembly respectively, according to the present invention. The adapter assembly (1) according to the present invention comprises a package body (10) and a plurality of pins (11) provide therein.

Figure 3A:
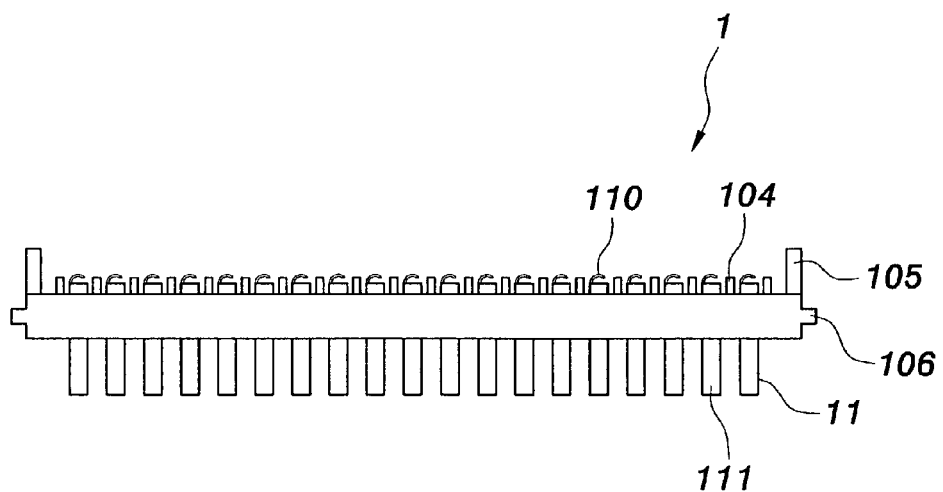
FIG. 3A shows a sectional view of the invented adapter assembly with a convex locking section (knobs)
Figure 5:
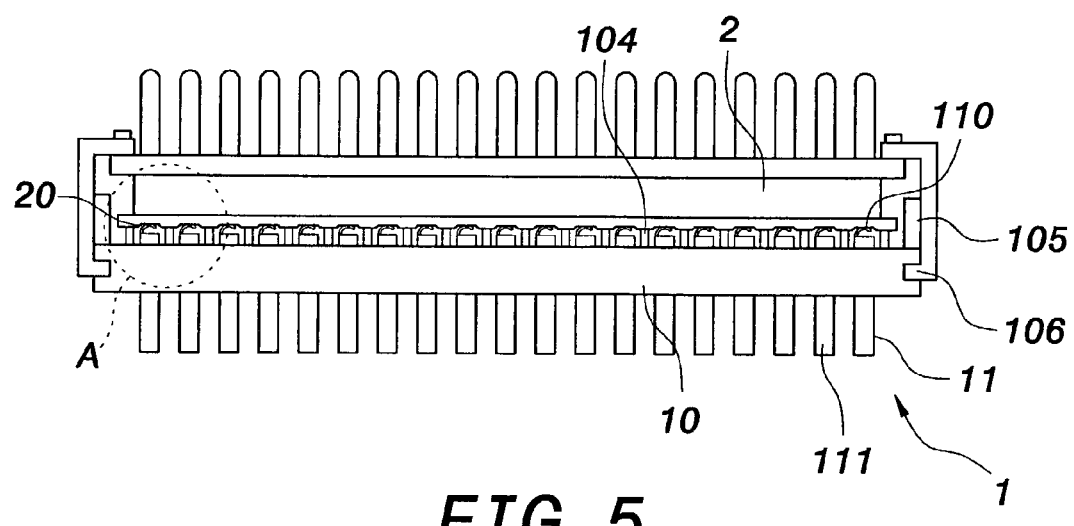
FIG. 5 shows an application of the invented adapter assembly.

The package body (10) is made of an insulating material, such as a plastic material, and has a plurality of through holes (100) in an array pattern therethrough. The package body (10) has an upper face (101), a lower face (102) and four lateral faces (103). A plurality of bumps (104) equal in height are arranged on the upper face (101). The plurality of bumps (104) are distributed uniformly between the through holes (100) to support an LGA packaged IC (2) thereon (as shown in FIG. 5), thus uniformly distributing the pressure of the LGA packaged IC (2) on the package body (10) and providing coplanar support for the LGA packaged IC (2) above the upper face (101). The lateral faces (103) of the package body (10) have a side guiding section (105) projecting upward for guiding the placement of the LGA packaged IC (2) on the package body (10). Moreover, the package body (10) has an L-shaped wedge section (107) at the corners thereof to provide better positioning and fixation. The package body (10) has a locking section (106) on the lateral faces (103) thereof. As shown in FIG. 3, the locking section (106) can be recessed, concave slots on the lateral faces (103). Alternatively, as shown in FIG. 3A, the locking section (106) can be protruded, convex knobs formed on the lateral faces (103). The locking section (106) is provided for latching the LGA packaged IC (2) and/or heat sink atop the adapter assembly (1).

Figure 2A:
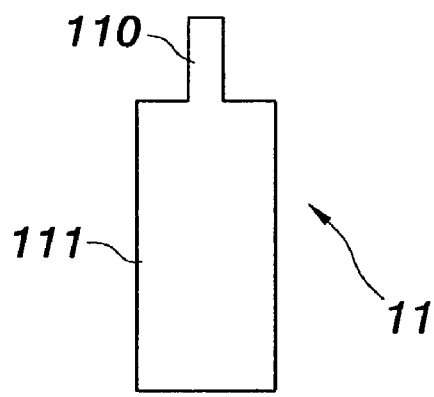
FIG. 2A shows a sectional view of the pin of the invented adapter assembly before the formation process.
Figure 2B:
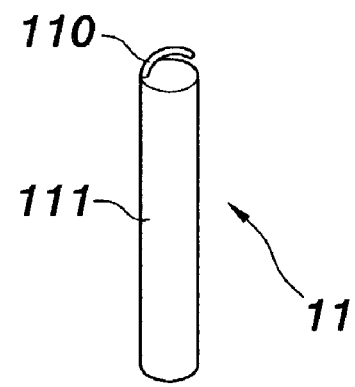
FIG. 2B shows a perspective view of the pin of the invented adapter assembly after the formation process.
Figure 2C:
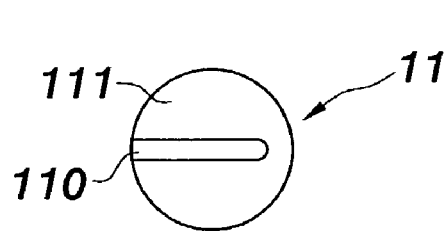
FIG. 2C shows a top view of the pin of the adapter assembly according to a first preferred embodiment of the present invention.
Figure 2D:
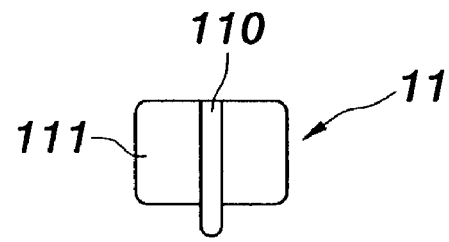
FIG. 2D shows a top view of the pin of the adapter assembly according to a second preferred embodiment of the present invention.
Figure 2E:
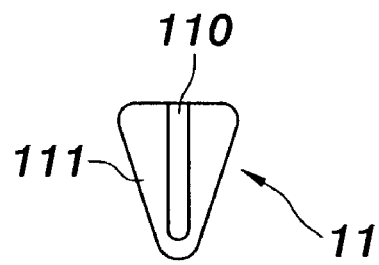
FIG. 2E shows a top view of the pin of the adapter assembly according to a third preferred embodiment of the present invention.
Figure 5A:
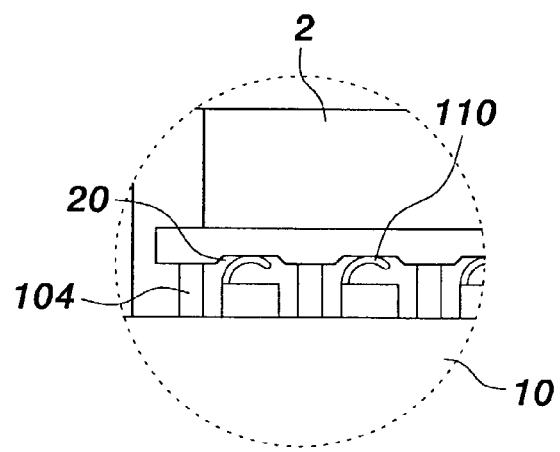
FIG. 5A is a partially enlarged view of FIG. 5, part A.

The pins (11) are formed by the processing of conductive elastic materials and received in the through holes (100). For example, the pins (11) can be made by the roll milling of beryllium copper alloy, as shown in FIG. 2A. Each of the pins (11) has a cantilevered spring end (110) at a top end thereof, as shown in FIG. 2B, and a cylindrical insertion end (111) at a bottom end thereof, as shown FIG. 2C. Alternatively, the insertion end (111) can also be of a rectangular pillar shape or of a triangular pillar shape, as shown in FIGS. 2D and 2E, respectively. The spring end (110) is provided extending out of the through hole (100) and protruding out of the upper face (101) for elastic contact an electrical contact land (20) of an LGA packaged IC (2). When the LGA packaged IC (2) is assembled onto the adapter assembly (1), the spring end 110 abuts against the matching electrical contact lands (20) on the bottom of the LGA packaged IC (2), as shown in FIG. 5A. Therefore, the pins (11) are electrically connected to the electrical contact lands (20) of the LGA packaged IC (2) by elastically pressing of the spring end (110) to the electrical contact. lands (20). The insertion ends (111) extend out of the through holes (100) and protrude out of the lower face (102) of the package body (10). The insertion ends (111) can be inserted into a PGA socket on a motherboard or on a printed circuit board.

To sum up, the adapter assembly according to the present invention has following advantages:

1. The circuit board with a PGA socket can not only use a PGA packaged IC, but also use a LGA packaged IC, which expands the utility and life time thereof and saves the cost of the manufacturers.

2. The LGA packaged IC can be employed not only in circuit boards therefore but also in circuit boards with PGA sockets by using the invented adapter assembly, which promotes the usage of LGA package, a cheaper solution than the PGA package.

Although the present invention has been described with reference to the preferred embodiments thereof, it will be understood that the invention is not limited or restricted to the details disclosed. Various substitutions and modifications can be implicated in the foregoing description, and others will occur to those with ordinary skill in the art. Therefore, all such substitutions and modifications are to be covered within the scope of the invention as outlined in the appended claims.

I claim:

1. An adapter for combining a land grid array (LGA) packaged integrated circuit (IC) with a pin grid array (PGA) socket, the adapter comprising:
   an adapter body having a plurality of through holes formed thereon and a plurality of uniformly distributed bumps on an upper face thereof for supporting the LGA packaged IC thereon; and
   a plurality of pins respectively fit within the through holes of the adapter body, and the pins each having a cylindrical insertion column and a cantilevered elastic arm integrally extended from a top portion of the insertion column;
   wherein the adapter body has at least one edge guiding section on a corner thereof;
   wherein the adapter body has a locking section on a lateral face thereof to latch the LGA packaged IC onto the package body, where the locking section is only applied at the edges of said adapter body; and
   wherein the cantilevered elastic arm of each pin elastically abuts against an electric contact land of the LGA packaged IC, and a bottom portion of the cylindrical insertion column of each pin connects to the PGA socket.

2. The adapter assembly as in claim 1, wherein the adapter body has at least one side guiding section on a lateral face thereof.

3. The adapter assembly as in claim 1, wherein the locking section is a concave slot.

4. The adapter assembly as in claim 1, wherein the locking section is a protruded knob.

5. The adapter assembly as in claim 1, wherein the adapter body is made of an insulating material.

6. The adapter assembly as in claim 5, wherein the adapter body is made of plastics.

7. The adapter assembly as in claim 1, wherein the pin is made of a conductive elastic material.

8. The adapter assembly as in claim 7, wherein the conductive material is beryllium copper alloy.

9. The adapter assembly as in claim 1, wherein said cantilevered elastic arm is a spring end.

10. The adapter assembly as in claim 1, wherein said bottom portion of the cylindrical insertion column is an insertion end for being received in a through hole.

11. An adapter for combining a land grid array (LGA) packaged integrated circuit (IC) with a pin grid array (PGA) socket, the adapter comprising:
    an adapter body having a plurality of through holes formed thereon and a plurality of uniformly distributed bumps on an upper face thereof for supporting the LGA packaged IC thereon; and
    a plurality of pins respectively fit within the through holes of the adapter body, and the pins each having a cylindrical insertion column and a cantilevered elastic arm integrally extended from a top portion of the insertion column;
    wherein the cantilevered elastic arm of each pin elastically abuts against an electric contact land of the LGA packaged IC, and
    a bottom portion of the cylindrical insertion column of each pin connects to the PGA socket.

* * * * *